(12) United States Patent
Kiyono et al.

(10) Patent No.: US 7,894,168 B2
(45) Date of Patent: Feb. 22, 2011

(54) THIN-FILM MAGNETIC HEAD COMPRISING A MAGNETO-RESISTIVE EFFECT DEVICE OF A CPP STRUCTURE AND HAVING A SHUNTING LAYER

(75) Inventors: Hiroshi Kiyono, Tokyo (JP); Tetsuya Kuwashima, Tokyo (JP)

(73) Assignee: TDK Corporation, Tokyo (JP)

( * ) Notice: Subject to any disclaimer, the term of this patent is extended or adjusted under 35 U.S.C. 154(b) by 791 days.

(21) Appl. No.: 11/846,170

(22) Filed: Aug. 28, 2007

(65) Prior Publication Data

US 2009/0059436 A1 Mar. 5, 2009

(51) Int. Cl.
*G11B 5/39* (2006.01)

(52) U.S. Cl. .............................. 360/324.12; 360/324.1; 360/324.11; 360/324.2

(58) Field of Classification Search ............... 360/324.1, 360/324.11, 324.12, 324.2
See application file for complete search history.

(56) References Cited

U.S. PATENT DOCUMENTS 6,914,758 B2    7/2005  Ryan et al.
7,151,654 B1 *  12/2006 Mao et al. ................. 360/324.2
2004/0207960 A1* 10/2004 Saito et al. ................ 360/324.1
2007/0091512 A1*  4/2007 Nichols et al. ........... 360/324.2

FOREIGN PATENT DOCUMENTS

JP       6-325331    11/1994
JP       2006-49571   2/2006

* cited by examiner

*Primary Examiner*—Jefferson Evans
(74) *Attorney, Agent, or Firm*—Oblon, Spivak, McClelland, Maier & Neustadt, L.L.P.

(57) ABSTRACT

The invention provides a thin-film magnetic head having a magneto-resistive effect device of the CPP (current perpendicular to plane) structure comprising a multilayer film in which a fixed magnetization layer, a nonmagnetic layer and a free layer are stacked together in order. The fixed magnetization layer, nonmagnetic layer and free layer extend away from an air bearing surface that is a plane in opposition to a medium, the length of the fixed magnetization layer in a depth direction normal to said air bearing surface is greater than the length of the free layer in the depth direction. A shunt layer for shunting the sense current is located at a farther distance in the depth direction than the free layer, and the shunt layer is separated from the free layer by a constant gap in the depth direction.

11 Claims, 15 Drawing Sheets

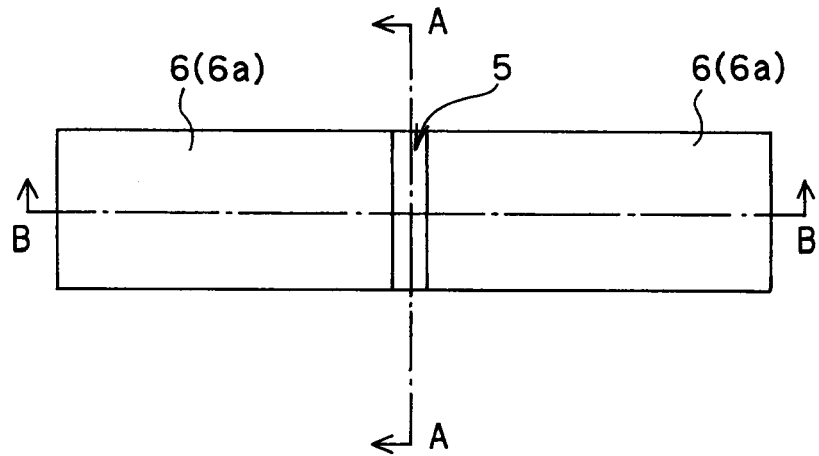
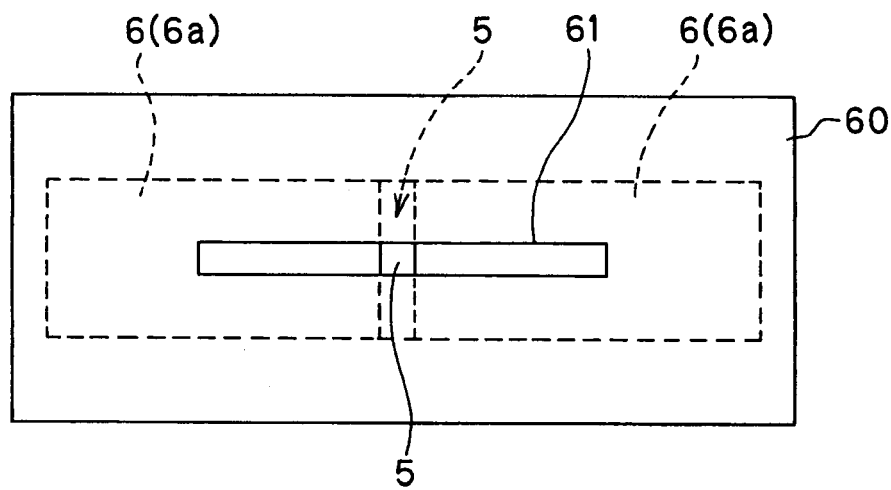
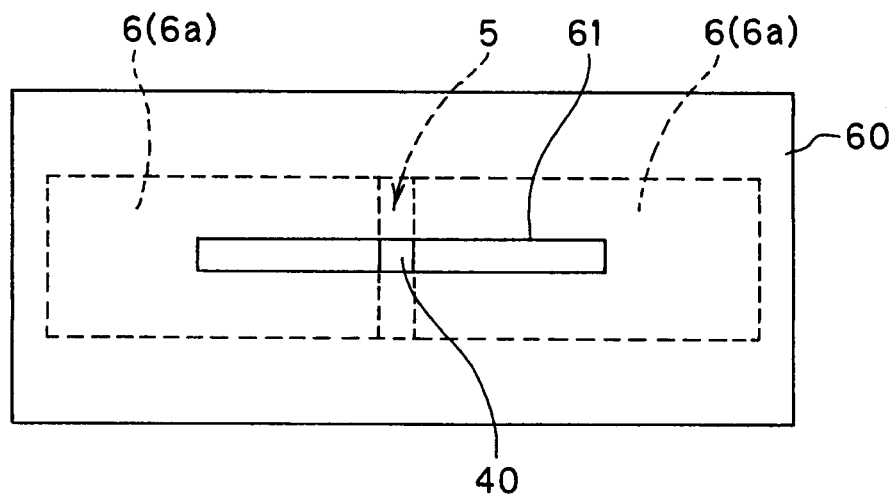

THIN-FILM MAGNETIC HEAD COMPRISING A MAGNETO-RESISTIVE EFFECT DEVICE OF A CPP STRUCTURE AND HAVING A SHUNTING LAYER

BACKGROUND OF THE INVENTION

1. Field of the Invention

The present invention relates to a thin-film magnetic head comprising a magneto-resistive effect device for reading the magnetic field strength of a magnetic recording medium or the like as signals, and a head gimbal assembly and a magnetic disk system, each comprising that thin-film magnetic head.

2. Explanation of the Prior Art

In recent years, with an increase in the plane recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often called the MR device) and a recording head having a write-only induction type magnetic device are stacked together.

The MR device, for instance, includes an AMR device harnessing the anisotropic magneto-resistive effect, a GMR device making use of the giant magneto-resistive effect, and a TMR device taking advantage of the tunnel-type magneto-resistive effect.

Requirements for reproducing heads, among others, are high sensitivity and high output. For reproducing heads meeting such requirements, GMR heads using a spin valve type GMR device have already been mass produced. The reproducing heads using a TMR device, too, are being mass produced so as to meet further improvements in the plane recording densities.

In general, the spin valve type GMR device comprises a nonmagnetic layer, a free layer formed on one surface of that nonmagnetic layer, a fixed magnetization layer formed on another surface of the nonmagnetic layer, and a pinning layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinning layer (antiferromagnetic layer). On each side of the device, there is a bias magnetic field-applying layer formed to apply a bias magnetic field to the free layer, thereby reducing Barkhausen noise.

By the way, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-MR device), too, are now under development as next-generation MR devices. The aforesaid TMR devices, too, would come under the CPP structure category according to a classification system from the current-passing direction alone.

A thin-film magnetic had comprising a magneto-resistive effect device of such CPP structure is in itself free of short circuits (poor insulation) between the device and the so-called magnetic shields located above and below that device. For this reason, the CPP structure could work much in favor of high recording densities.

As the recording density grows high, however, there are the following problems with the CPP structure: (1) as the device size becomes small and narrow, the head resistance grows high with degradation of the frequency characteristics, making it difficult for the device to adapt well to higher frequencies, (2) as the device size becomes small and narrow, it causes the volume of the device itself to decrease, and spins are likely to get erratic, resulting in an increase in the thermal magnetic noise and a worsening of the S/N ratio, (3) as the device size becomes small and narrow, the number of particles constituting the pinning layer (anti-ferromagnetic layer) or the bias magnetic field-applying layers declines, responsible for performance fluctuations, and so on.

In view of such situations, the invention has been made with a view to providing a thin-film magnetic head wherein even when device size becomes small and narrow, degradation of frequency characteristics is held back, any increase in the thermal magnetic noise is stayed off, and performance fluctuations are minimized.

SUMMARY OF THE INVENTION

According to the invention, the aforesaid object is accomplishable by the provision of a thin-film magnetic head comprising a magneto-resistive effect device of a CPP (current perpendicular to plane) structure including a multilayer film in which a fixed magnetization layer, a nonmagnetic layer and a free layer are stacked together in order, with a sense current passing in a thickness direction of said multilayer film, wherein said free layer functions such that the direction of magnetization changes depending on an external magnetic field, said fixed magnetization layer has a direction of magnetization fixed by an antiferromagnetic layer exerting pinning action, a bias magnetic field-applying layer is formed at each end of said multilayer film in a width direction, said fixed magnetization layer, said nonmagnetic layer and said free layer extend away from an air bearing surface that is a plane in opposition to a medium, and the length of said fixed magnetization layer in a depth direction normal to said air bearing surface is greater than the length of said free layer in said depth direction, and a shunt layer for shunting the sense current is located at a farther distance in said depth direction than the free layer, and said shunt layer is separated from said free layer by a constant gap in the depth direction.

In a preferable embodiment of the thin-film magnetic head according to the invention, said shunt layer is formed of the same material of which the free layer is formed.

In a preferable embodiment of the thin-film magnetic head according to the invention, said shunt layer is formed on said nonmagnetic layer.

In a preferable embodiment of the thin-film magnetic head according to the invention, said free layer and said shunt layer are mutually separated and formed once formed as a one-piece film.

In a preferable embodiment of the thin-film magnetic head according to the invention, the size of a depth-wise constant gap formed between said free layer and said shunt layer is 10 nm to 100 µm, wherein said gap is filled up with a nonmagnetic material.

In a preferable embodiment of the thin-film magnetic head according to the invention, said nonmagnetic film is $Al_2O_3$, $SiO_2$, MgO, $TiO_2$, or HfO.

In a preferable embodiment of the thin-film magnetic head according to the invention, said magneto-resistive effect device of the CPP structure is a TMR device.

In a preferable embodiment of the thin-film magnetic head according to the invention, said magneto-resistive effect device of the CPP structure is a CPP-MR device.

In a preferable embodiment of the thin-film magnetic head according to the invention, that magnetic head further comprises a pair of electrodes for passing a current in the stacking direction of the magneto-resistive effect device of the CPP structure.

The invention also provided a head gimbal assembly, comprising a slider including the aforesaid thin-film magnetic head and located in opposition to a recording medium, and a suspension adapted to resiliently support said slider.

Further, the invention provides a magnetic disk system, comprising a slider including the aforesaid thin-film magnetic head and located in opposition to a recording medium, and a positioning means adapted to support and position said slider with respect to said recording medium.

BRIEF EXPLANATION OF THE DRAWINGS

FIGS. 6A to 6F are illustrative in plane over time of how to fabricate the construction of part of the invention in particular.

DETAILED EXPLANATION OF THE PREFERRED EMBODIMENTS

The best mode for carrying out the invention is now explained in details.

Figure 1:
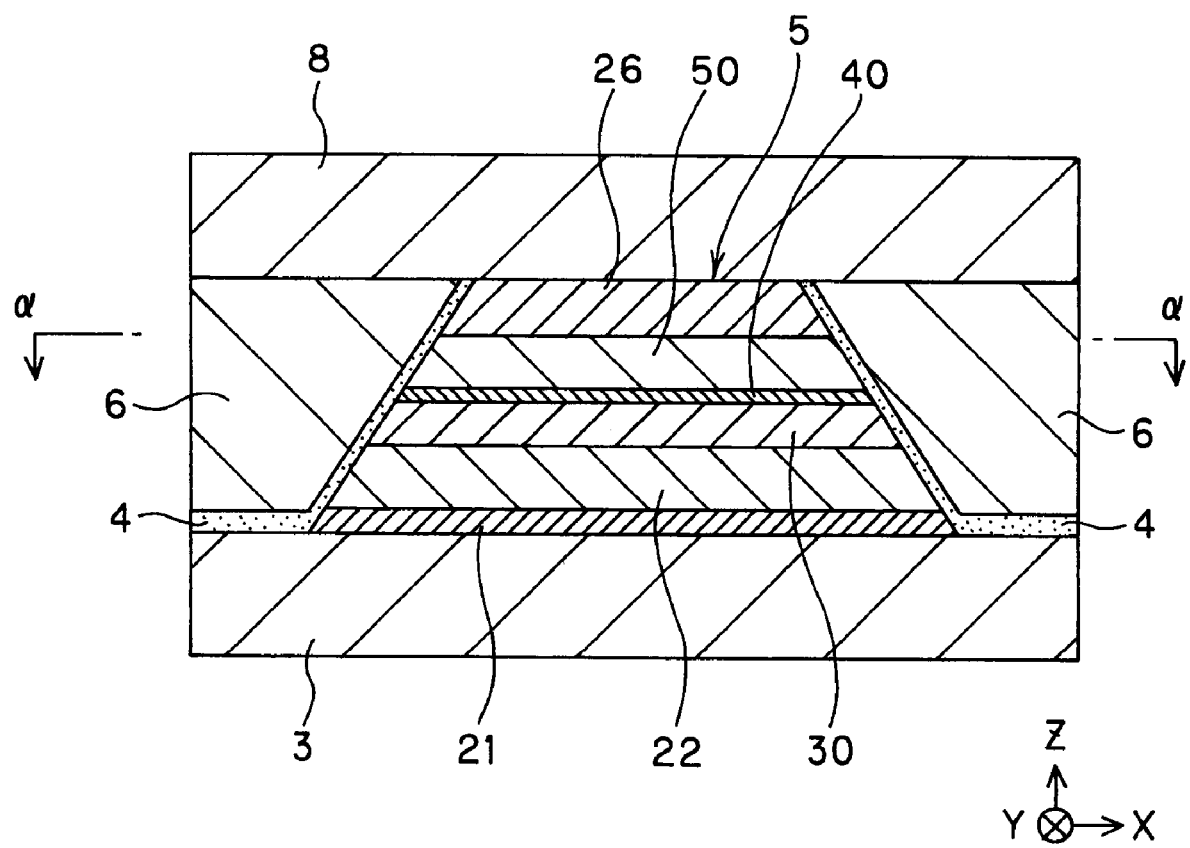
FIG. 1 is illustrative in section of the reproducing head in particular parallel with the medium opposite plane in an embodiment of the invention.

FIG. 1 is illustrative of the ABS (air bearing surface) of an embodiment of the invention; it is illustrative in schematic of the ABS of the magneto-resistive effect device (CPP-MR device) in particular—part of the invention. The abbreviation "ABS" is generally corresponding to a plane (hereinafter often called the medium opposite plane) at which the reproducing head is in opposition to a recording medium; however, it is understood that the ABS here includes even a section at a position where the multilayer structure of the device can be clearly observed. For instance, a protective layer such as DLC (the protective layer adapted to cover the device), in a strict sense, positioned at the medium opposite plane may be factored out, if necessary.

Figure 2:
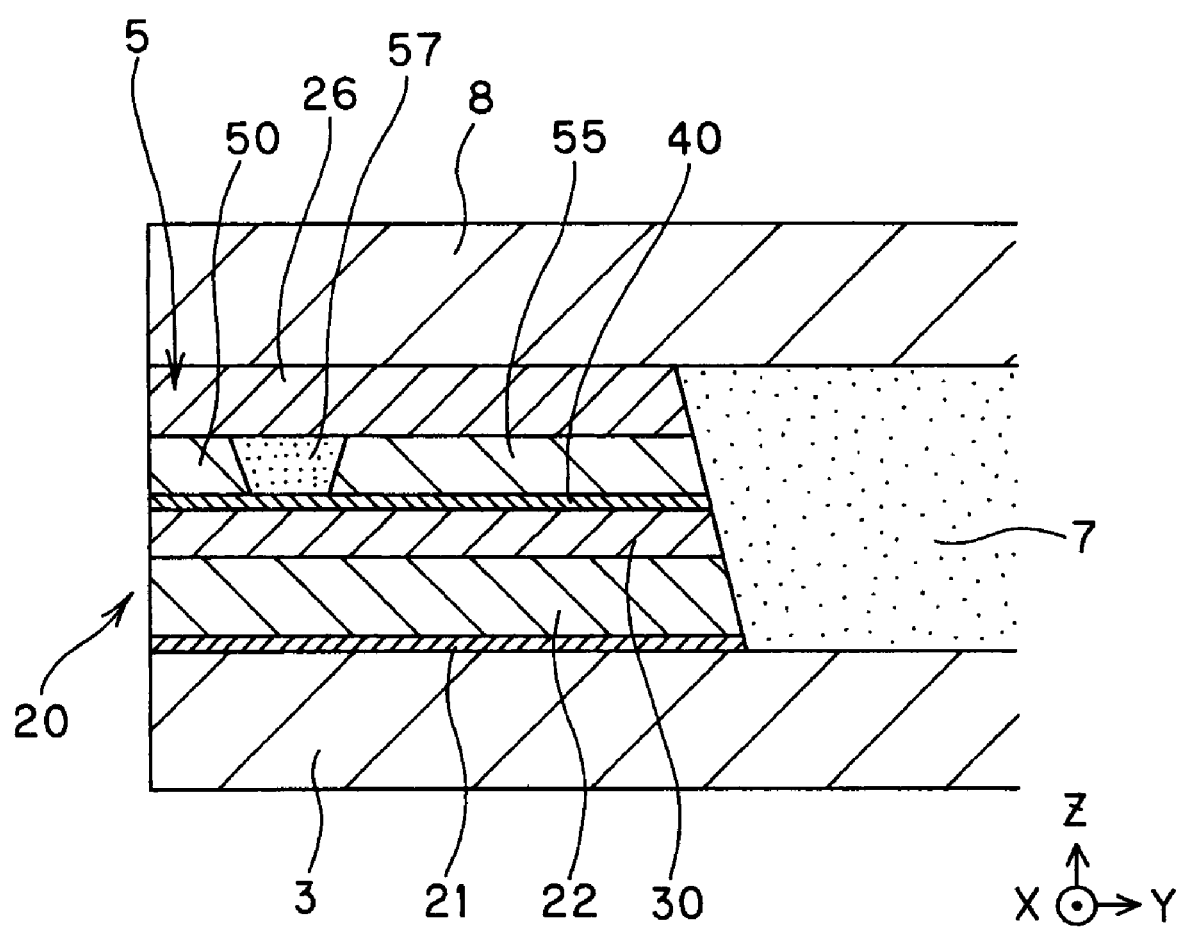
FIG. 2 is illustrative in longitudinal section of FIG. 1.
Figure 3:
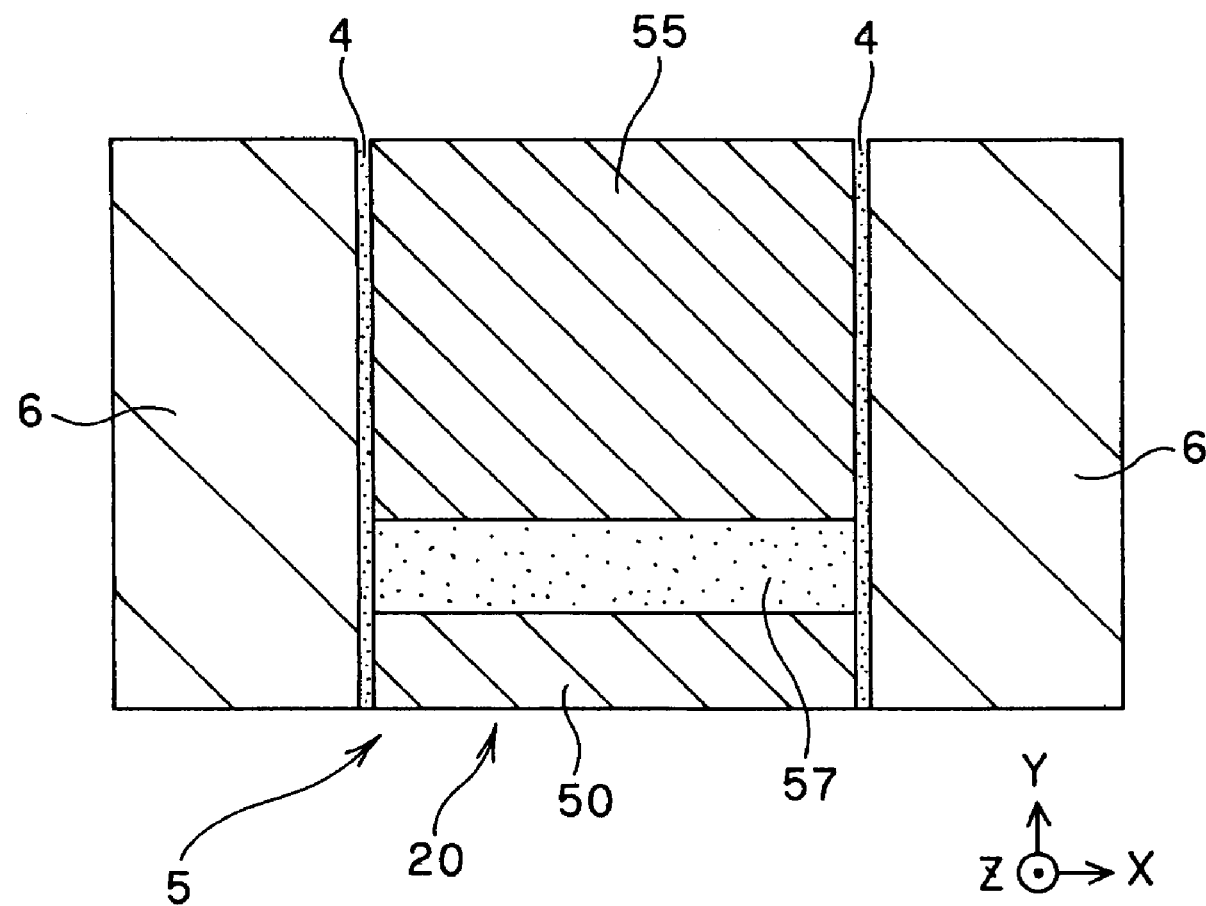
FIG. 3 is a sectional view as taken on a-a arrowed section of FIG. 1; it provides an easy-to-understand representation of the construction of part of the invention.

FIG. 2 is illustrative in schematic of the longitudinal section of FIG. 1, and FIG. 3 is a sectional view as taken on a-a arrowed line of FIG. 1, which helps an easy understanding of the construction of part of the invention.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Magneto-resistive Effect Device of the CPP Structure (CPP-MR Device)]

The construction of the reproducing head comprising the inventive magneto-resistive effect device of the CPP structure (CPP-MR device) is now explained at great length with reference to FIGS. 1, 2 and 3.

The magneto-resistive effect device of the CPP structure (CPP-MR device), for instance, includes a CPP-GMR device harnessing the giant magneto-resistive effect, and a TMR device making use of the tunnel-type magneto-resistive effect.

In general, the CPP-GMR device comprises a non-magnetic layer, a free layer formed on one surface of the nonmagnetic layer, a fixed magnetization layer formed on the other surface of the nonmagnetic layer, and a pinning layer (generally an antiferromagnetic layer) formed in contact with the side of the fixed magnetization layer that faces away from the nonmagnetic layer. The free layer has the direction of magnetization changing depending on a signal magnetic field from outside, and the fixed magnetization layer has the direction of magnetization fixed by an exchange coupling magnetic field from the pinning layer (the antiferromagnetic layer).

In general, the TMR device comprises a free layer, a fixed magnetization layer, a tunnel barrier layer interposed between them, and a pinning layer (antiferromagnetic layer) located on the surface of the fixed magnetization layer that faces away from the surface in contact with the tunnel barrier layer. The tunnel barrier layer is a nonmagnetic layer through which electrons with spins reserved can pass by way of the tunnel effect. Other layers, for instance, the free layer, fixed magnetized layer and pinning layer (antiferromagnetic layer) could be basically identical with those used with the spin valve type GMR device.

(Explanation of the General Construction of the Reproducing Head)

FIG. 1 is illustrative of the section of the reproducing head parallel with the medium opposite plane, as noted above. As shown in FIG. 1, the reproducing head according to the embodiment here comprises a first shield layer 3 (often called the lower shield layer 3) and a second shield layer 8 (often called the upper shield layer 8) that are located at a given space and opposed vertically on the sheet, a magneto-resistive effect device 5 (often called simply the CPP-MR device 5) interposed between the first shield layer 3 and the second shield layer 8, an insulating film 4 adapted to cover two side of the CPP-MR device 5 and a part of the upper surface of the first shield layer 3 along those side, and two bias magnetic field-applying layers 6 located in such a way as to be adjacent to both sides of the CPP-MR device 5 by way of the insulating film 4.

In the embodiment here, the first 3 and the second shield layer 8 take a so-called magnetic shield role plus a pair-of-electrodes role. In other words, they have not only a function of shielding magnetism but also function as a pair of electrodes adapted to pass the sense current through the CPP-MR device 5 in a direction intersecting the plane of each of the layers constituting the CPP-MR device 5, for instance, in the direction perpendicular to the plane of each of the layers constituting the CPP-MR device 5 (stacking direction).

Apart from the first 3 and the second shield layer 8, another pair of electrodes may be additionally provided above and below the CPP-MR device 5.

[Explanation of the Construction of Part of the Invention in the Reproducing Head]

In the reproducing head of the invention shown in FIGS. 1, 2 and 3, the CPP-MR device 5 has a multilayer film wherein an antiferromagnetic layer 22 formed on the first shield layer 3 via an underlay layer 21 and functioning as a pinning layer, a fixed magnetization layer 30 formed on the antiferromagnetic layer 22, a nonmagnetic layer 40 formed on the fixed magnetization layer 30, a free layer 50 formed on the nonmagnetic layer 40 and a cap layer (protective layer) 26 formed on the free layer 50 are stacked together in order. This multilayer film is held between the first 3 and the second shield layer 8, and by applying voltage between the first 3 and the second shield layer 8, there is a sense current flowing in the thickness direction of the multilayer film.

The free layer 50 has its magnetization direction changing dependent on an external magnetic field. The fixed magnetization layer 30 has its magnetization direction fixed by the antiferromagnetic layer 22 having a pinning action.

As shown in FIG. 2, the multilayer film comprising the antiferromagnetic layer 22, fixed magnetization layer 30, nonmagnetic layer 40 and free layer 50 forming the CPP-MR device 5 extends rearward (the depth-wise side: the Y-direction) from the air bearing surface 20 that is a plane in opposition to the medium.

As depicted in FIG. 2, the length on the depth-wise side of the antiferromagnetic layer 22 and fixed magnetization layer 30 is longer than that on the depth-wise side of the free layer 50. And in the invention, further on the depth-wise side of the free layer 50, a shunt layer 55 for shunting the sense current is formed at a constant space from the free layer 50. As depicted in FIG. 2, the shunt layer 55 is formed on the antiferromagnetic layer 22 and fixed magnetization layer 30 that is more on the depth-wise side of the free layer 50 and longer than the free layer 50. The shunt layer 55 is formed on, and in direct contact with, the nonmagnetic layer 40.

Between the free layer 50 and the shunt layer 55, there is a nonmagnetic separation layer 57 formed for separating these layers 50 and 55 at a constant gap. For instance, this permits the sense current applied from the second shield layer 8 side to the first shield layer 3 side to be shunted into a current flowing through the free layer 50 and a current flowing through the shunt layer 55. That is, as depicted in FIG. 2, the sense current applied from the second shield layer 8 to the first shield layer 3 is shunted into two flow passages that direct from the nonmagnetic separation layer 57 toward the side of the multilayer structure having the free layer 50 and the side of the multilayer structure having the shunt layer 55.

It is then the free layer 50 that functions as the magneto-resistive effect device upon reception of a signal magnetic field from outside. The provision of the shunt layer 55 allows the resistance of the whole device to get low, because the resistance R1 of the multilayer structure having the free layer 50 is connected in parallel with the resistance R2 of the multilayer structure having the shunt layer 55. This makes a lot more contribution to improvements in the frequency characteristics. The provision of the shunt layer 55 also permits the device capacity to increase with a decrease in the device resistance, resulting in a decrease in the shot noise and thermal magnetic noise and improvements in the S/N.

Further, the provision of the shunt layer 55 makes it possible to extend the device in the rear (the depth-wise side). This in turn leads to an increase in both the number of alloy particles constituting the bias magnetic field-applying layers 6 located near the device and the number of alloy particles constituting the anti-ferromagnetic layer 22 having the pinning effect; so the bias action and pinning action are more reliably exerted so that performance fluctuations are much more reduced—the advantage of the invention.

Usually, it is desirous to form the shunt layer 55 of the same material of which the free layer 50 is formed with a view to simplifying the fabrication process involved. In short, in consideration of more efficient fabrication, it is desired that once the free layer 50 and the shunt layer 55 have been formed as one single piece, it is separated into each film. For the details, see the fabrication process to be described later.

The size of the depth-wise constant gap formed between the free layer 50 and the shunt layer 55 should be about 10 nm to 100 μm. As that gap size is less than 10 nm, there may be a risk of the ferromagnetic coupling of the free layer 50 with the shunt layer 55. As that gap size exceeds 100 μm, on the other hand, there is inconvenience: much difficulty in locating the device in the slider.

Typically, such a gap may be formed by providing a recess first, and then filling it with a nonmagnetic material to form the nonmagnetic separation layer 57. The nonmagnetic material used here, for instance, includes an insulating material such as $Al_2O_3$, $SiO_2$, MgO, $TiO_2$, and HfO.

In what follows, each of the layers constituting the CPP-MR device 5 will be explained in further details.

(Explanation of the Fixed Magnetization Layer 30)

In the invention, the fixed magnetization layer 30 is formed on the antiferromagnetic layer 22 having the pinning action via the underlay layer 21 formed on the first shield layer 3.

The fixed magnetization layer 30 may be configured in either one single layer form or multilayer form.

Referring typically to the multilayer film that is a preferable form, the fixed magnetization layer has a so-called synthetic pinned layer comprising, in order from the side of the antiferromagnetic layer 22, an outer layer, a nonmagnetic intermediate layer and an inner layer, all stacked together in order.

The outer and the inner layer are each provided by a ferromagnetic layer made of, for instance, a ferromagnetic material containing Co, and Fe. The outer and the inner layer are antiferromagnetically coupled and fixed such that their magnetization directions are opposite to each other.

The outer, and the inner layer is preferably formed of, for instance, a $Co_{70}Fe_{30}$ (at %) alloy layer. The outer layer has a thickness of preferably about 3 to 7 nm, and the inner layer has a thickness of preferably about 3 to 10 nm.

The nonmagnetic intermediate layer, for instance, is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50 and Cap Layer 26)

The free layer 50 has its magnetization direction changing depending on an external magnetic field, i.e., a signal magnetic field from the recording medium, and is formed of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers.

As shown in FIG. 1, there is the cap (protective) layer 26 formed on the free layer 50. The cap layer 26, for instance, is formed of a Ta or Ru layer, and has a thickness of about 0.5 to 20 nm.

(Explanation of the Nonmagnetic Layer 40)

The CPP-MR device 5 here is represented by the so-called CPP-GMR device and TMR device. For this reason, the nonmagnetic layer 40, for instance, is made of one material selected from the group consisting of $Al_2O_3$, MgO, Cu, Ag, Au, Pt, Al, ZnO, $SiO_2$, $TiO_2$, and HfO, and has a thickness of about 1.0 to 2.0 nm. Although FIG. 2 shows that another nonmagnetic layer 40 is formed under the nonmagnetic separation layer 57 that separates the free layer 50 from the shunt layer 55, it is understood that for simplification of fabrication, it may be dispensed with.

(Explanation of the Antiferromagnetic Layer 22)

The antiferromagnetic layer 22 functioning as the pinning layer works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows antiferromagnetism even in the absence of heat treatment to induce an exchange coupling magnetic field between it and a ferromagnetic material, and (2) a heat treatment type antiferromagnetic material that is going to show antiferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 5 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the antiferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of about 2 to 6 nm as an example.

Further, the insulating layer 4 shown in FIG. 1 is made of, for instance, alumina. For the bias magnetic field-applying layers 6, for instance, a hard magnetic layer (hard magnet) or a multilayer structure of a ferromagnetic layer and an antiferromagnetic layer may be used, and there is the specific mention of CoPt or CoCrPt.

(Explanation of One Example of How to Fabricate the Construction of Part of the Invention in the Reproducing Head)

One example of the general fabrication process for the construction of part of the invention in the reproducing head described above is now explained with reference to FIGS. 4A to 4F, FIGS. 5A to 5F, and FIG. 6A to 6F.

Figure 4A:
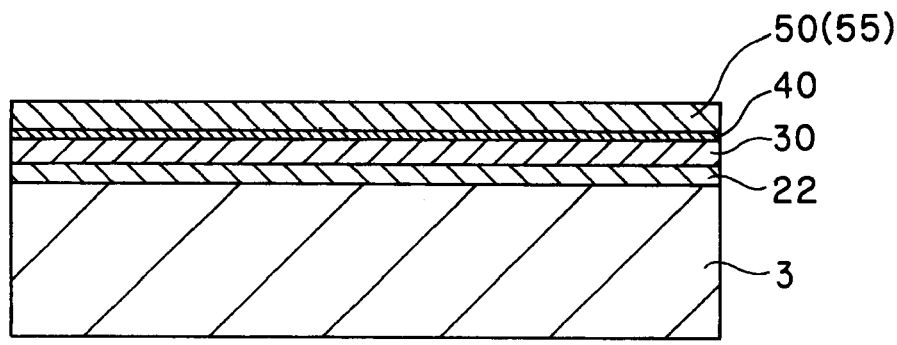
FIGS. 4A to 4F are illustrative in section over time of how to fabricate the construction of part of the invention in particular; they are sectional views as taken on A-A section of FIG. 6A.
Figure 4B:
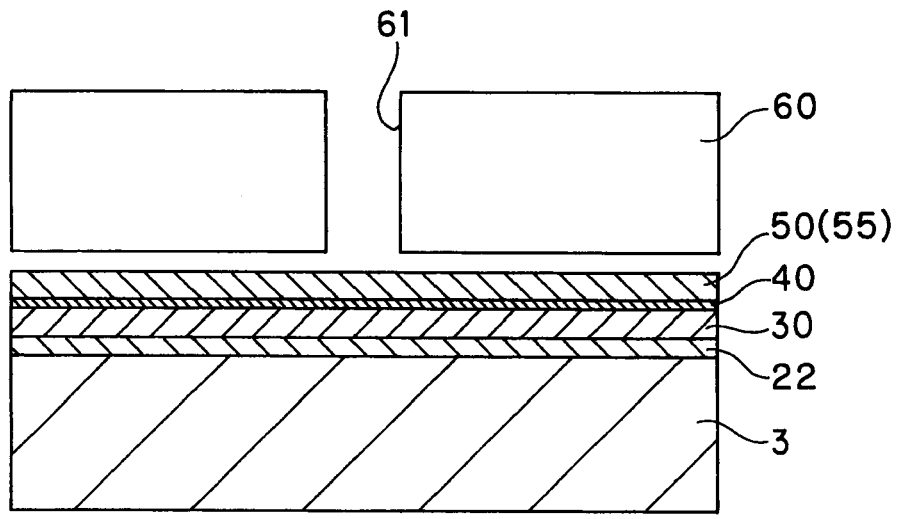
Figure 4C:
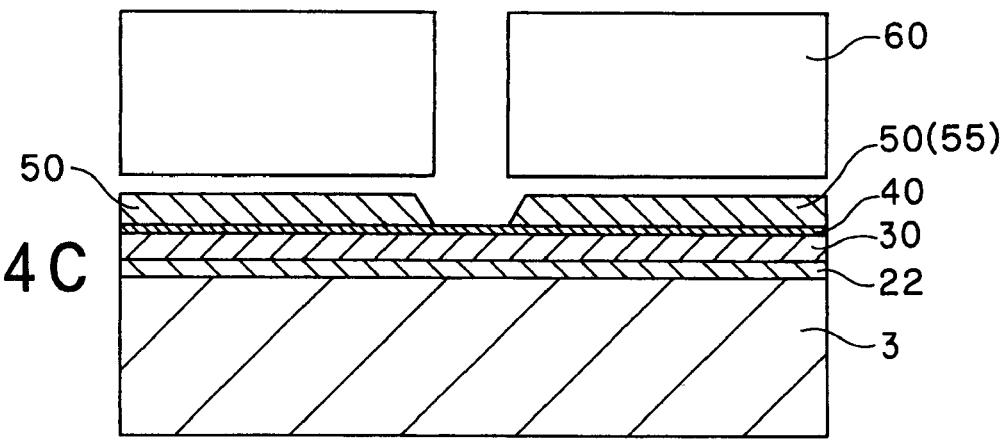
Figure 4D:
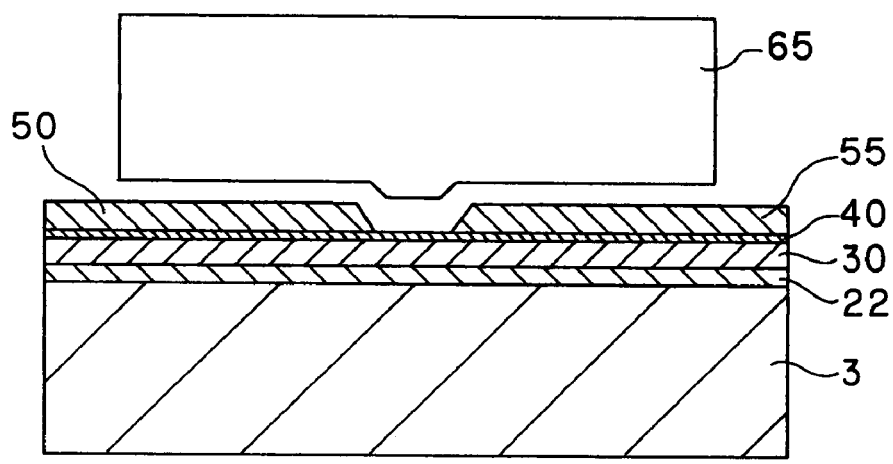
Figure 4E:
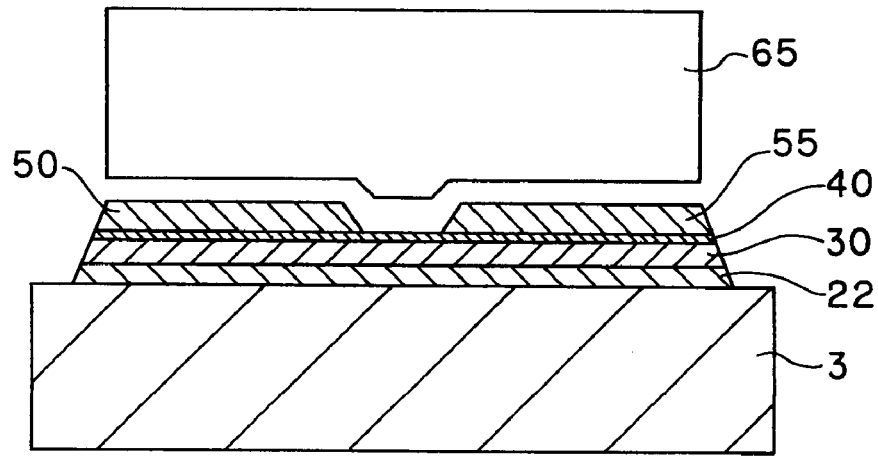
Figure 4F:
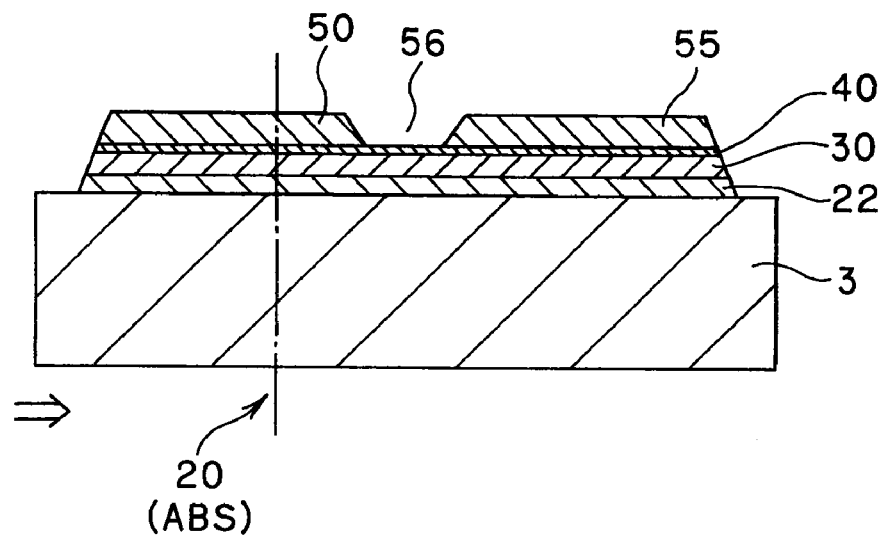
Figure 5A:
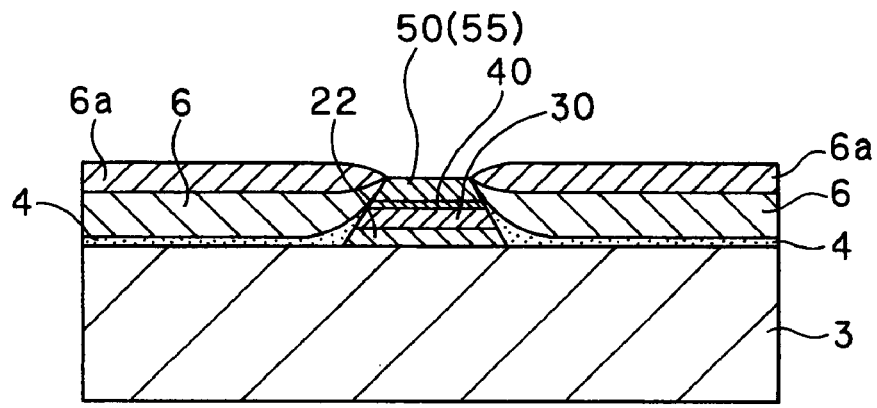
FIGS. 5A to 5F are illustrative in section over time of how to fabricate the construction of part of the invention in particular; they are sectional views as taken on B-B section of FIG. 6A.
Figure 5B:
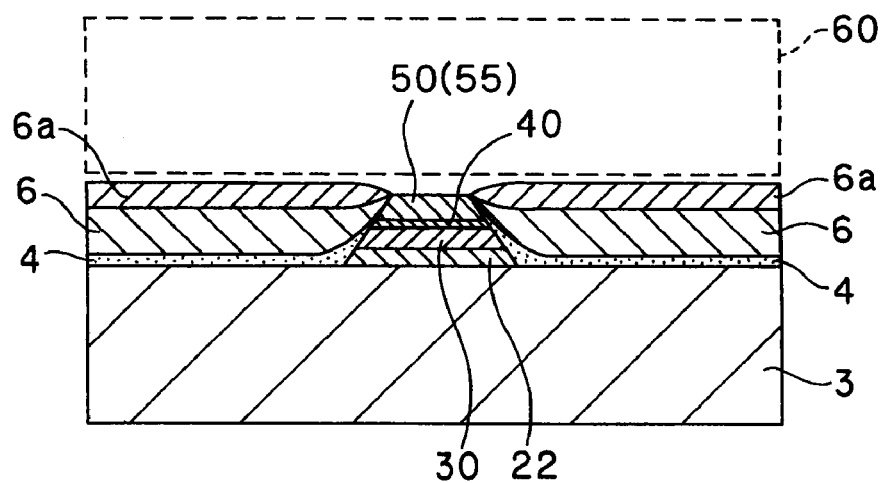
Figure 5C:
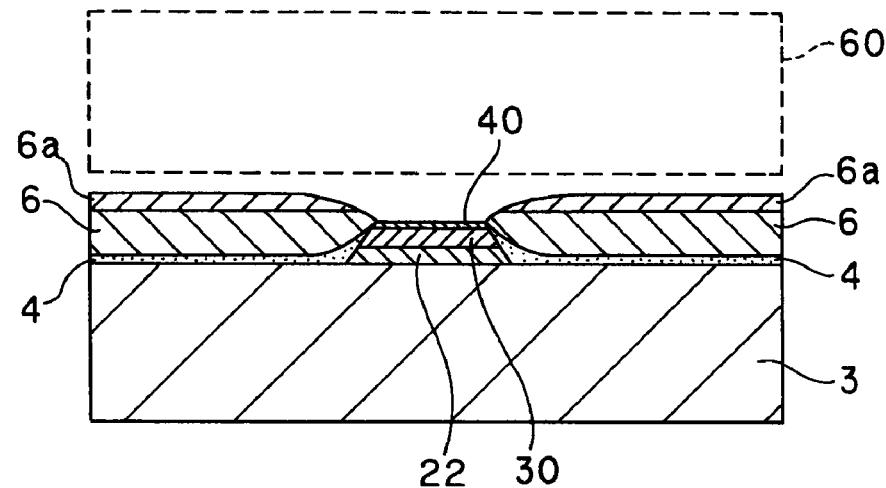
Figure 5D:
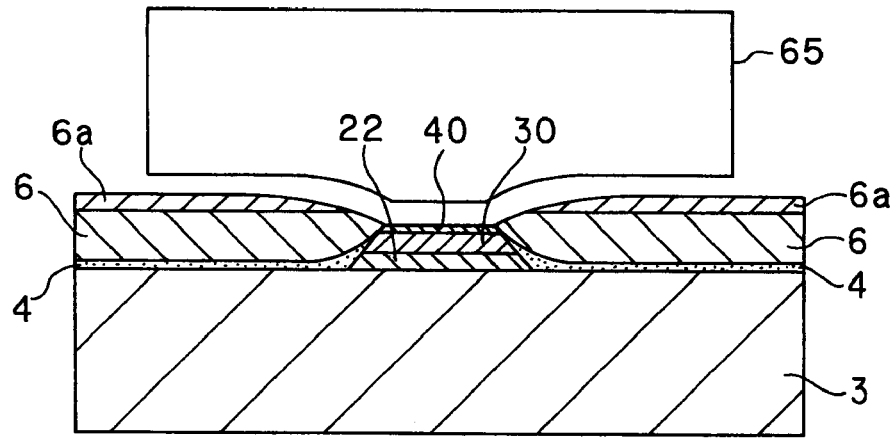
Figure 5E:
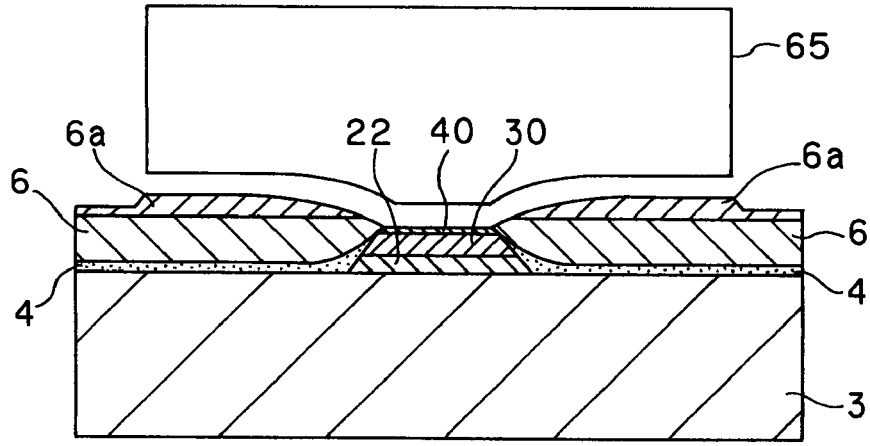
Figure 5F:
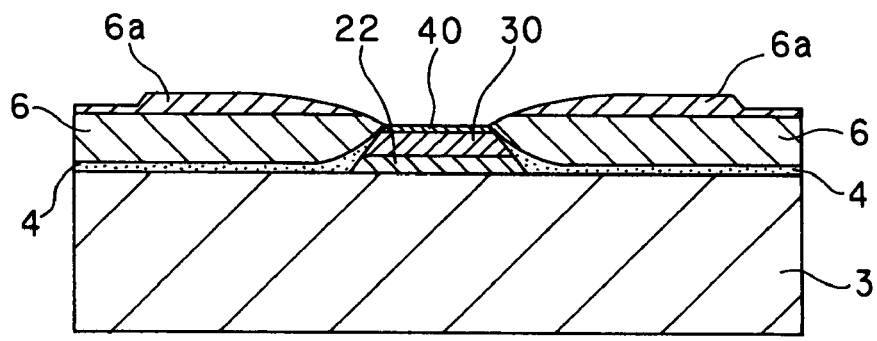
Figure 6D:
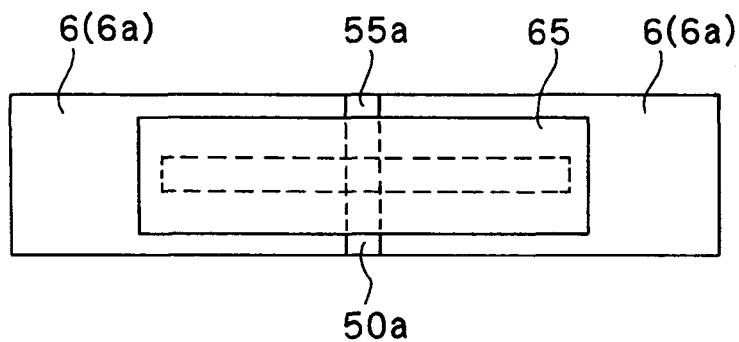

FIGS. 4F to 4F are illustrative in section over time of how to fabricate the construction of part of the invention in particular; they are views as taken on A-A section of FIG. 6A. FIGS. 5A to 5F are illustrative in section over time of how to fabricate the construction of part of the invention in particular; they are views as taken on B-B section of FIG. 6A. FIGS. 6A to 6F are plan view illustrative over time of how to fabricate the site of the construction of the invention in particular.

Note here that in FIGS. 4, 5 and 6, the drawings with the same alphabet affixed to them (for instance, FIG. 4A, FIG. 5A and FIG. 6A) are illustrative in section and plane of the same process step.

(1) Steps Prior to the States Shown in FIGS. 4A, 5A and 6A

The steps prior to the states shown in FIGS. 4A, 5A and 6A are as follows. That is, planar films of the antiferromagnetic layer 22, fixed magnetization layer 30, non-magnetic layer 40 and free layer 50 are stacked on the first shield layer 3 in order thereby forming a multilayered planer film. Then, while masking is carried out in such a way as to leave open only the location of the device portion 5 depicted in FIG. 6A, the rest is etched off and dug down to the first shield layer 3. Thereafter, the site formed by etching is filled up with the insulating layer 4, bias magnetic field-applying layers 6 and the protective layer 6a for those layers 6 in order. In this way, the states depicted in FIGS. 4A, 5A and 6A are turned up (see FIG. 5A in particular).

Although differing depending on device design, the protective layer 6a for the bias magnetic field-applying layers 6 may in principle be made of any desired material at any desired thickness, provided that it cannot be etched off in the etching time for the free layer. Preferably but not exclusively, Ta, Cr, Ru or the like is usable. The protective layer 6a for the bias magnetic field-applying layers 6 also takes a role of temporarily protecting them upon the etching for the free layer to be described later.

For simplification of illustration, and for an easy understanding of only the essential part in particular, the underlay layer 21 formed under the antiferromagnetic layer 22 is left out of illustration.

(2) Explanation of the Steps Depicted in FIGS. 4B, 5B and 6B

To etch substantially the middle portion of the free layer 50, photolithography is used to form a photoresist 60 comprising an opening 61 of given shape. The opening 61 is configured as an oblong slit as depicted in FIG. 6B.

(3) Explanation of the Steps Depicted in FIGS. 4C, 5C and 6C

Using the photoresist 60 comprising the opening 61 of given shape, substantially the middle of the free layer 50 is etched (see FIG. 4C in particular). Etching may be carried out by, for instance, RIE (reactive ion beam etching). For the gas here, for instance, a mixed gas of Ar+$CH_3OH$ may be used at a flow rate of about 50 sccm for Ar and about 100 sccm for $CH_3OH$. Typically, etching is carried out at a source power of about 2,000 W and a pressure of about 1 Pa.

The etched site of substantially the middle of the free layer defines a recess for the formation of the nonmagnetic separation layer 57 (see FIGS. 2 and 3). By this recess, the original free layer 50 is completely broken down into two, so that the free layer 50 and the shunt layer 55 (see FIGS. 2 and 3) are separated and formed.

It is here noted that upon the etching of substantially the middle of the free layer 50, the nonmagnetic layer 40 lying under the free layer 50 etched may be entirely or partly removed off. It is also noted that insofar as the advantage of the invention is achievable, there may be etching making its way to the fixed magnetization layer 30.

As can also be seen from FIG. 6C, the opening 61 in the photoresist 60 makes its way into the area with the protective layer 6a for the bias magnetic field-applying layers 6; however, there is none of direct etching of the bias magnetic field-applying layers 6 due to the presence of the protective layer 6a for them (see FIG. 5C).

At the end of this step, the nonmagnetic separation layer 57 is filled and formed with the formation of the cap layer 26.

(4) Explanation of the Steps Depicted in FIGS. 4D, 5D and 6D

The photoresist 60 as described above is removed. Thereafter, photolithography is used to form a photoresist 65 of such given shape as depicted so as to etch the antiferromagnetic layer 22 and fixed magnetization layer 30 thereby delimiting the device configuration.

Figure 6E:
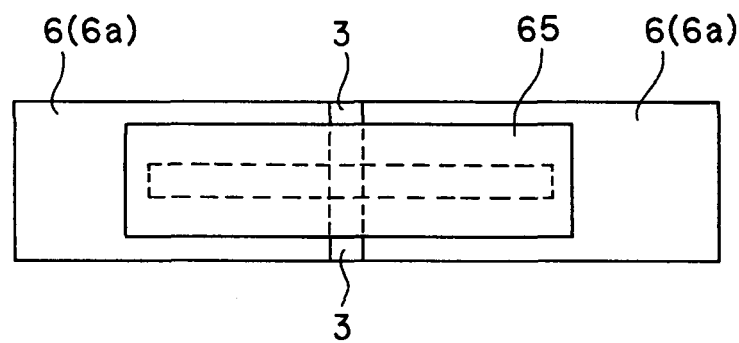

(5) Explanation of the Steps Depicted in FIGS. 4E, 5E and 6E

Etching for a peripheral site not covered with the photoresist 65 is implemented until the first shield layer 3 is exposed to view. Etching may be implemented by, for instance, ion milling at a beam angle of about 0 to 25 degrees. The gas here, for instance, may be Ar gas at a flow rate of about 5 to 20 sccm.

Figure 6F:
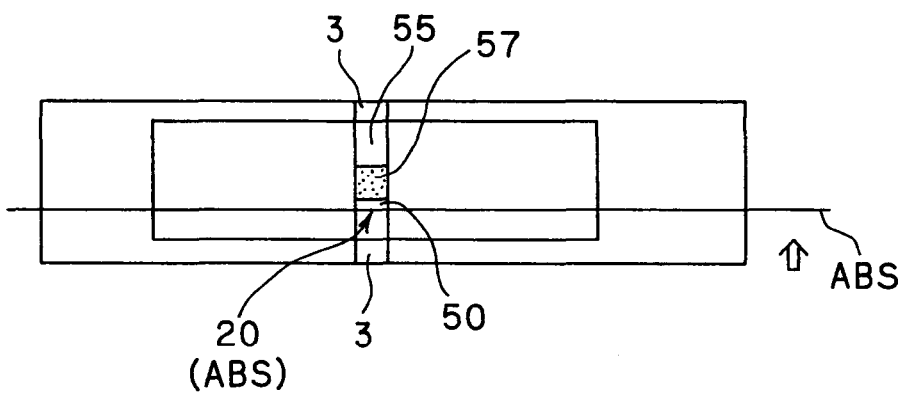

(6) Explanation of the Steps Depicted in FIGS. 4F, 5F and 6F

After removal of the photoresist 65, polishing is implemented (in the arrowed direction) as far as the ABS depicted in FIGS. 4F and 6F thereby determining the MR height.

(Explanation of the Whole Construction of the Thin-film Magnetic Head)

The whole construction of the thin-film magnetic head comprising the aforesaid magneto-resistive effect device is now explained.

Figure 7:
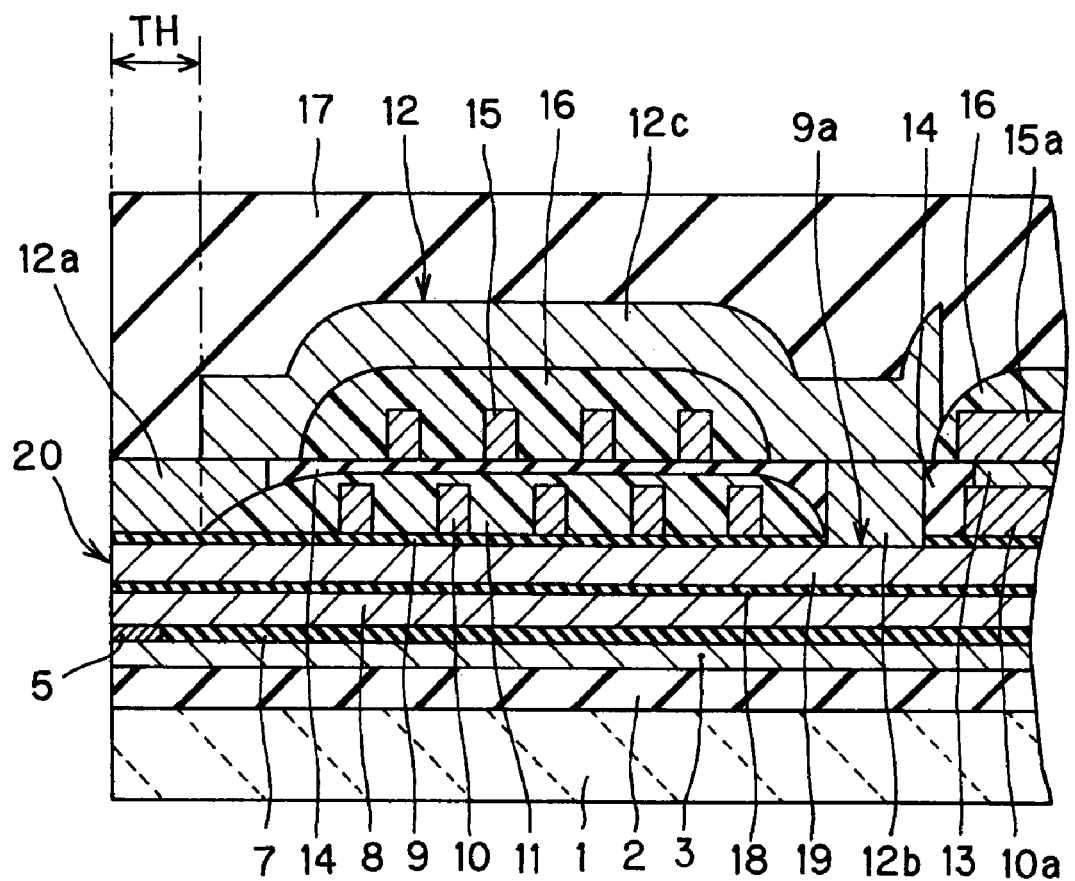
FIG. 7 is illustrative of the construction of the thin-film magnetic head according to one preferable embodiment of the invention; it is a sectional view illustrative of a section of the thin-film magnetic head perpendicular to the medium opposite plane and the substrate.
Figure 7:
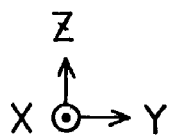
Figure 8:
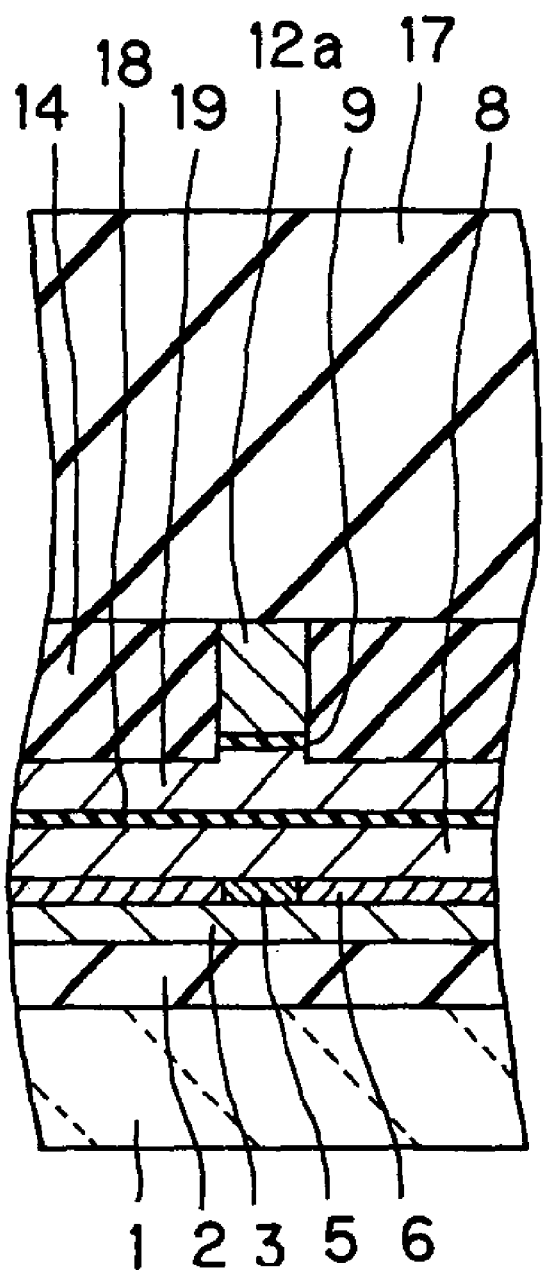
FIG. 8 is illustrative of the construction of the thin-film magnetic head according to one preferable embodiment of the invention; it is illustrative of a section of the magnetic pole portion of the thin-film magnetic head parallel with the medium opposite plane.
Figure 8:
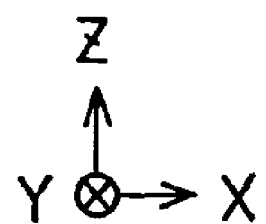

FIGS. 7 and 8 are illustrative of the whole construction of the thin-film magnetic head according to one preferred embodiment of the invention; FIG. 7 is illustrative of a section of the thin-film magnetic head perpendicular to the ABS and substrate, and FIG. 8 is illustrative of a section of the magnetic pole portion of the thin-film magnetic head parallel with the ABS.

The whole structure of the thin-film magnetic head would be better understood when consideration is given to its fabrication process steps; the whole structure of the thin-film magnetic head is now explained with reference to its fabrication process steps.

First of all, the insulating layer 2 comprising an insulating material such as alumina ($Al_2O_3$) or silicon dioxide ($SiO_2$) is formed by sputtering or like techniques on the substrate 1 comprising a ceramic material such as AlTiC ($Al_2O_3$.TiC). That insulating layer has a thickness of typically about 0.5 to 20 μm.

Then, the lower shield layer 3 comprising a magnetic material and adapted for a reproducing head is formed on that insulating layer 2. The shield layer 3 has a thickness of typically about 0.1 to 5 μm. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, the reproducing CPP-MR device 5 is formed on the lower shield layer 3. The construction and formation of the device has already been described above.

Although not shown in FIGS. 7 and 8, an insulating film is then formed in such a way as to cover the two sides of the MR device 5 and the upper surface of the lower shield layer 3. The insulating film is formed of an insulating material such as alumina.

Then, the two bias magnetic field-applying layers 6 are formed in such a way as to be adjacent to the two sides of the MR device 5 via the insulating layer. Then, the insulating layer 7 is formed in such a way as to be located around the CPP-MR device 5 and bias magnetic field-applying layers 6. The insulating layer 7 is formed of an insulating material such as alumina.

Then, the upper shield layer 8 for the reproducing head, comprising a magnetic material, is formed on the CPP-MR device 5, bias magnetic field-applying layers 6, and insulating layer 7. The upper shield layer 8, for instance, is formed by means of plating or sputtering.

Then, the separation layer 18 comprising an insulating material such as alumina is formed by sputtering or the like on the upper shield layer 8. Then, the lower magnetic pole layer 19, comprising a magnetic material and adapted for a recording head, is formed by plating, sputtering or the like on the separation layer 18. The magnetic material used for the upper shield layer 8, and the lower magnetic pole layer 19, for instance, includes a soft magnetic material such as NiFe, CoFe, CoFeNi, and FeN. It is here noted that instead of the multilayer arrangement of the upper shield layer 8, separation layer 18 and lower magnetic pole layer 19, it is acceptable to configure the upper shield layer in such a way as to work also as a lower electrode layer.

Then, the recording gap layer 9 comprising a nonmagnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, the first layer portion 10 of the thin-film coil, typically comprising copper (Cu), is formed on the recording gap layer 9 at a thickness of typically 2 to 3 μm. In FIG. 7, note that reference numeral 10a stands for a connector portion of the first layer portion 10, which is to be connected to the second layer portion 15 of the thin-film coil to be described later. The first layer portion 10 is wound around the contact hole 9a.

Then, the insulating layer 11 comprising a photoresist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion layer 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 8, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 7, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photoresist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type magnetic device).

The recording head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin-film coils 10, 15 at least a part of which is located between the lower 19 and the upper magnetic pole layer 12 while insulated from them.

As shown in FIG. 7, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

(Explanation of How the Thin-film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to the direction perpendicular to the medium opposite plane 20. At the CPP-MR device 5 with no signal magnetic field applied yet, the magnetization direction of the free layer 50 lies in alignment with the direction of the bias magnetic field, and the magnetization direction of the fixed magnetization layer 30 is fixed in the direction perpendicular to the medium opposite plane 20.

At the CPP-MR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-MR device 5. The resistance value of the CPP-MR device 5 may be found from a potential difference between the first and second shield layers, i.e., the two electrode layers 3 and 8 at the time when the sense current is passed through the MR device. It is thus possible for the reproducing head to play back the information recorded in the recording medium.

(Explanation of the Head Gimbal Assembly and the Magnetic Disk System)

The head gimbal assembly and the magnetic disk system according to the embodiment here are now explained.

A slider 210 included in the head gimbal assembly is first explained with reference to FIG. 9. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 9.

The substrate 211 is in a generally hexahedral shape. Of the six surfaces of the substrate 211, one surface is in opposition to the hard disk. On that one surface there is a medium opposite plane 20 formed.

Figure 9:
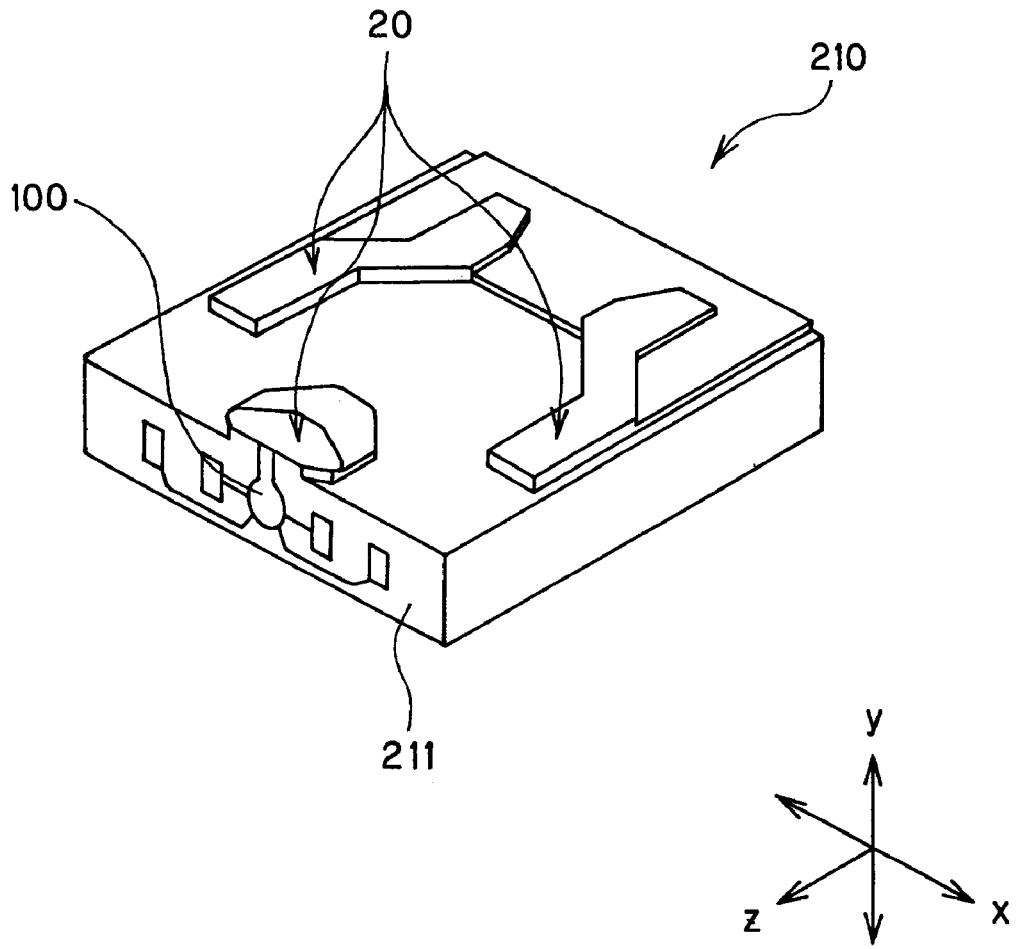
FIG. 9 is a perspective view of a slider built in the head gimbal assembly according to one embodiment of the invention.

As the hard disk rotates in the z-direction in FIG. 9, it causes an air flow passing between the hard disk and the slider 210 to induce lift in the downward y-direction in FIG. 9. This lift in turn causes the slider 210 to levitate over the surface of the hard disk. Note here that the x-direction in FIG. 9 traverses tracks on the hard disk.

Near the end of the slider 210 on an air exit side (the left lower end in FIG. 9), there is the thin-film magnetic head 100 formed according to the embodiment here.

A head gimbal assembly 220 according to this embodiment is now explained with reference to FIG. 10. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 10:
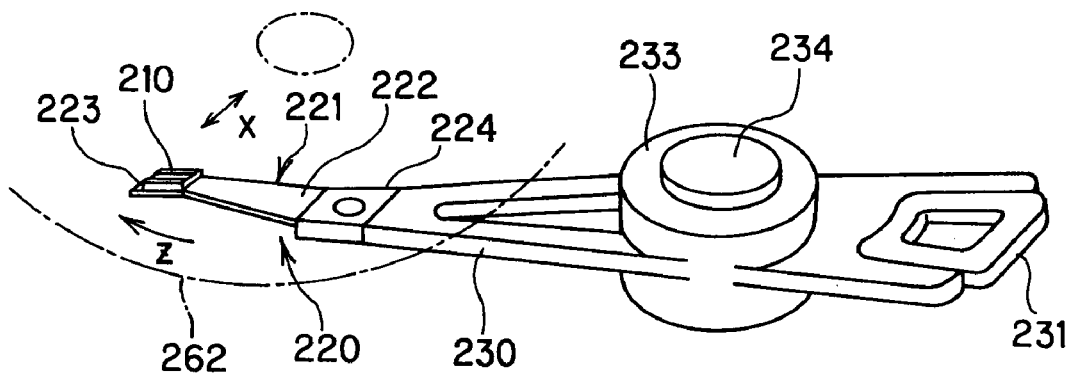
FIG. 10 is a perspective view of a head arm assembly including the head gimbal assembly according to one embodiment of the invention.

FIG. 10 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 11 and 12.

Figure 11:
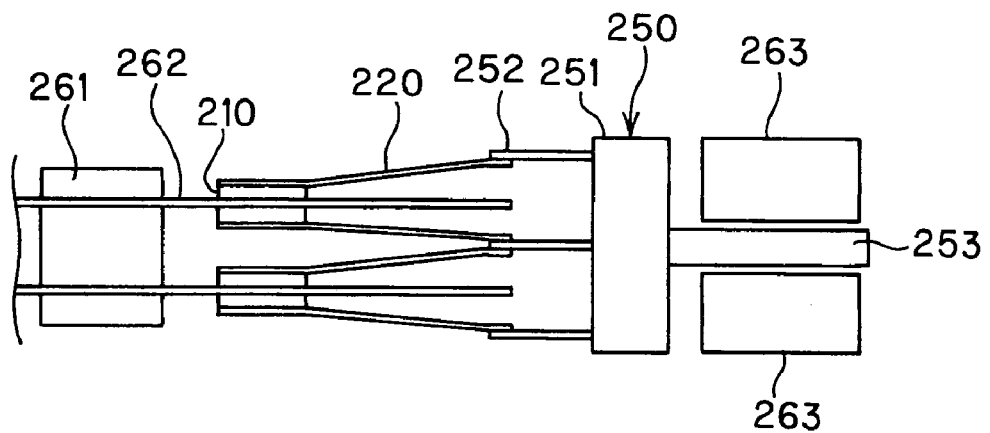
FIG. 11 is illustrative of part of the magnetic disk system according to one embodiment of the invention.
Figure 12:
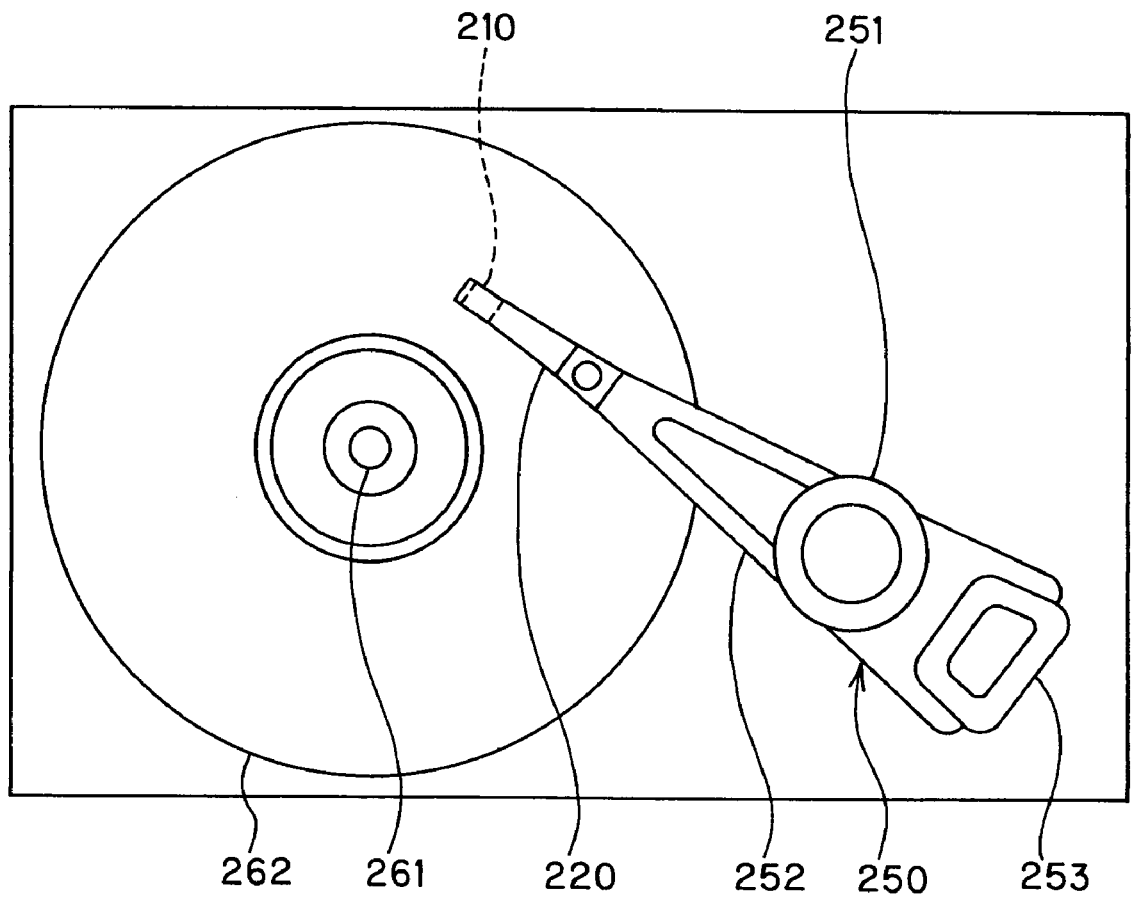
FIG. 12 is a plan view of the magnetic disk system according to one embodiment of the invention.

FIG. 11 is illustrative of part of the magnetic disk system, and FIG. 12 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the magnetic disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXPLANATION OF THE SPECIFIC EXPERIMENTAL EXAMPLES

The invention relating to the thin-film magnetic head having such a CPP-MR device as described above is now explained in more details with reference to the following specific experimental examples.

Experimental Example I

Inventive samples 1 and 2 as well as a comparative sample were prepared as mentioned below.

[Preparation of Inventive Sample 1]

A thin-film magnetic head comprising such an inventive magneto-resistive effect device of the CPP structure as shown in FIGS. 1, 2 and 3 was prepared. That is, as the magneto-resistive effect device of the CPP structure, there was a TMR device readied up that was of the construction wherein the shunt layer 55 for shunting the sense current was located more on the depth-wise side of, and kept constantly away from, the free layer 50.

In such a device structure, as shown in FIG. 2, the sense current applied from the second shield layer 8 to the first shield layer 3 is shunted from the nonmagnetic separation layer 57 to two flow passages that direct toward the multilayer structure side having the free layer 50 and the multilayer structure side having the shunt layer 55. Note here that the multilayered film structure was designed such that the resistance R1 of the multilayer structure having the free layer 50 (hereinafter called simply the "free #1") was 1,100 Ω(ohm). The size of the "free #1" was 27 nm in width and 34 nm in height (the width and height here lie in the Y- and Z-directions).

Also, the multilayered film structure was designed such that the resistance R2 of the multilayer structure having the shunt layer 55 (hereinafter called simply the "shunt #2") was 400 Ω(ohm). Since the resistances R1 and R2 are connected together in parallel, the resistance of the whole device stays low.

The multilayer film was made of such specific materials as tabulated in Table 1 given just below.

TABLE 1

(Inventive sample 1)

| Multilayer structure | | Layer materials | Thickness (nm) |
|---|---|---|---|
| Second shield layer (8) | | NiFe | 2000 |
| Cap layer (26) | | Ru | 10.0 |
| Free layer (50) and shunt layer (55) | | CoFe | 4.0 |
| Nonmagnetic separation layer (57) | | Al$_2$O$_3$ | 4.0 |
| Fixed magnetization layer (30) | Inner layer | CoFe | 2.0 |
| | Nonmagnetic intermediate layer | Ru | 0.8 |
| | Outer layer | CoFe | 2.5 |
| Antiferromagnetic layer (22) | | IrMn | 7.0 |
| Underlay layer (21) | | Ta | 2.0 |
| | | NiCr | 2.0 |
| First shield layer (3) | | NiFe | 2000 |

[Preparation of inventive sample 2]

In the aforesaid inventive sample 1, the resistance R2 of the multilayer structure having the shunt layer 55 (hereinafter called simply the "shunt #2") was changed from 400 Ω(ohm) to 100 Ω(ohm).

Note here that to change the resistance R2 of the "shunt #2" from 400 Ω(ohm) to 100 Ω(ohm), the area of the shunt layer 55 was quadrupled as large.

Otherwise, inventive sample 2 was prepared as in the aforesaid inventive sample 1.

Preparation of the Comparative Example

In the aforesaid inventive sample 1, there was none of the multilayer structure having the shunt layer 55.

Otherwise, the comparative sample was prepared as in the aforesaid inventive sample 1.

That is, the comparative sample was free of the shunt layer 55; so it was a conventional so-called TMR device in which the resistance R1 of the device having the free layer 50 was 1,100 Ω(ohm).

Inventive samples 1 and 2 and the comparative sample were estimated in terms of (1) frequency characteristics and (2) to what degree the S/N was improved in the following way.

(1) Frequency Characteristics

As frequency shifts toward a high frequency side, the initial gain goes down gradually. The cutoff frequency at which the initial gain goes from its initial value down by 3 dB was found. The larger the cutoff value, the better the frequency characteristics could be.

Figure 13:
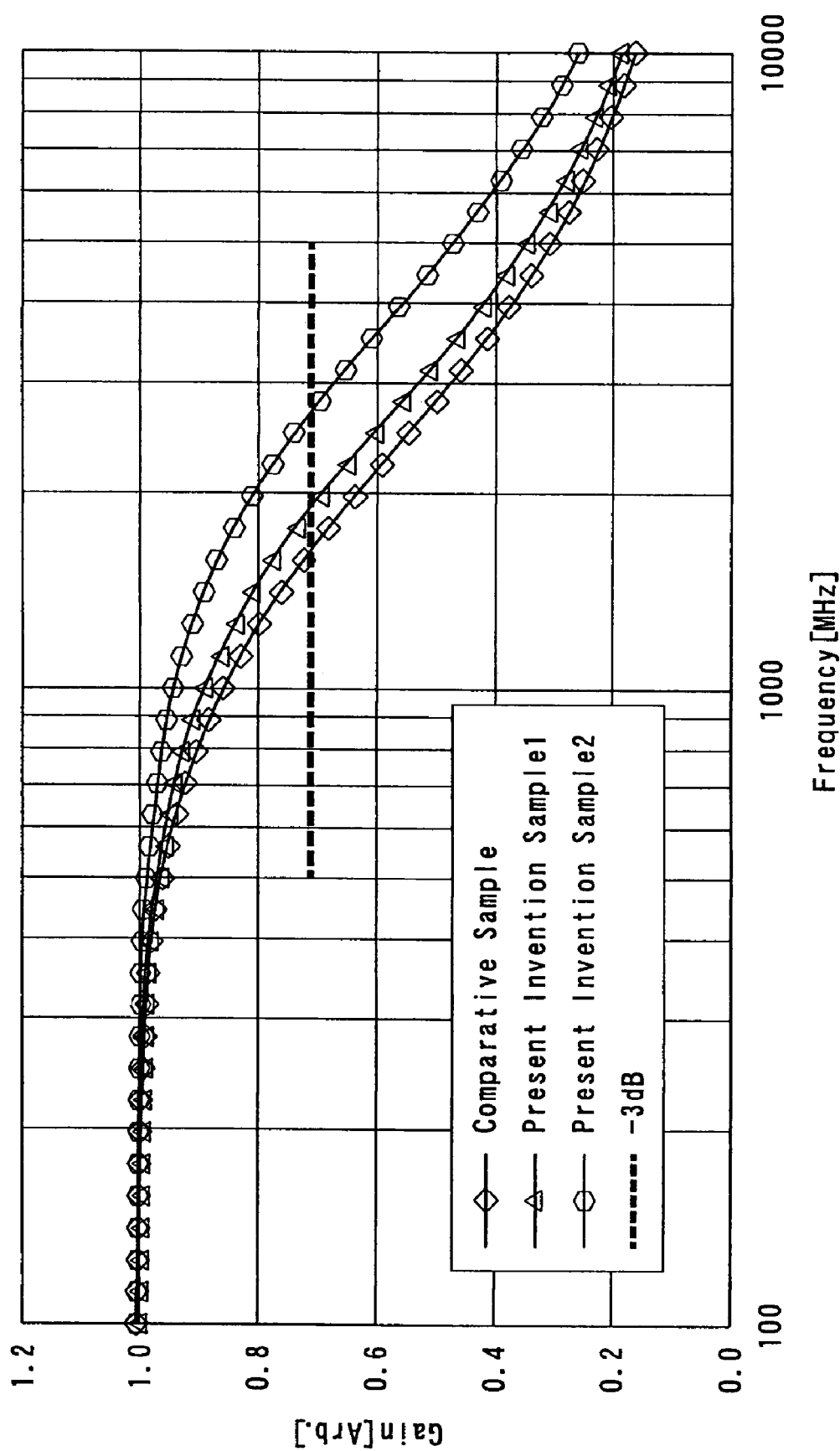
FIG. 13 is a graph indicative of the frequency characteristics of each sample in the experimental examples.

The results are shown in FIG. 13.

From the results of FIG. 13, it is appreciated that the cutoff frequency of the comparative sample is 1,630 MHz, whereas the inventive sample 1 with the 1,100Ω device connected in parallel with the 400Ω device has its cutoff frequency shifting up to a higher 1,890 MHz. Further, the inventive sample 2 with 1,100Ω device connected in parallel with the 100Ω device has its cutoff frequency shifting up to an even higher 2,680 MHz.

(2) Improvements in the S/N

Head output S (μVo-p) and noise N (μVrms) were measured to figure out the S/N of each sample from the equation: S/N=20 log(S/N).

Figure 14:
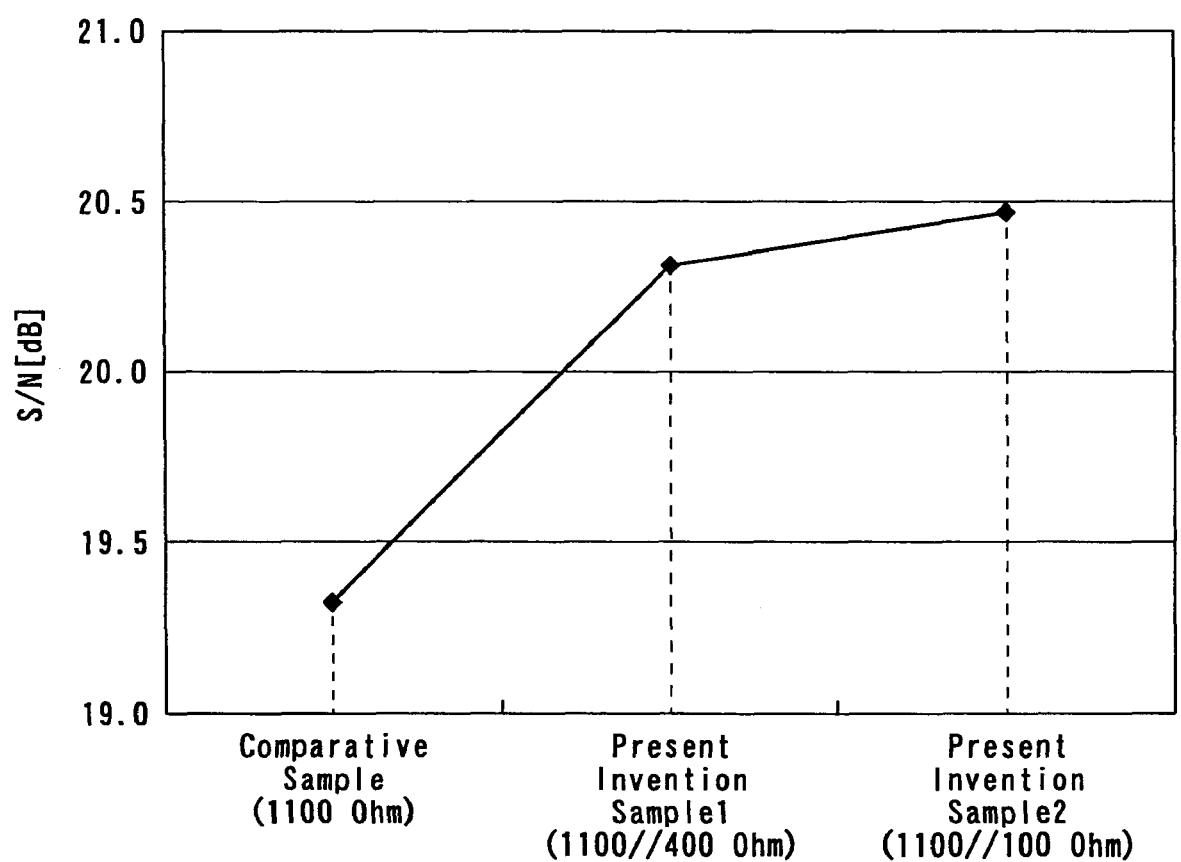
FIG. 14 is a graph with the S/N's of the respective samples in the experimental examples plotted.

The results are shown in FIG. 14.

From the results of FIG. 14, it is seen that the inventive samples 1 and 2 are by far more improved in the S/N than the comparative sample. A possible reason for it could be that the shot noise decreases yet the device capacity increases with a decreasing device resistance, so that there is a decrease in the thermal magnetic noise.

From the aforesaid results of experimentation, the advantages of the invention would be undisputed. That is, the invention provides a thin-film magnetic head having a magneto-resistive effect device of the CPP (current perpendicular to plane) structure comprising a multilayer film in which a fixed magnetization layer, a nonmagnetic layer and a free layer are stacked together in order, wherein the fixed magnetization layer, nonmagnetic layer and free layer extend rearward from an air bearing surface that is a plane in opposition to a medium, the length of the depth-wise side of the fixed magnetization layer is longer than that of the free layer, and a shunt layer for shunting a sense current is formed more on the depth-wise side of, and kept constantly away from, the free layer. Thus, there are much more favorable advantages obtained: even when device size is further reduced and narrowed, degradation of frequency characteristics is hold back, any increase in the thermal magnetic noise is stayed off, and performance fluctuations are minimized.

The present invention can have applications to the industry of magnetic disk systems comprising a magneto-resistive effect device adapted to read the signal strength of magnetic recording media as signals.

What we claim is:

1. A thin-film magnetic head comprising:
a magneto-resistive effect device of a CPP (current perpendicular to plane) structure including a multilayer film in which a fixed magnetization layer, a nonmagnetic layer and a free layer are stacked together in order, with a sense current passing in a thickness direction of said multilayer film, wherein
said free layer is configured such that the direction of magnetization changes depending on an external magnetic field;
said fixed magnetization layer has a direction of magnetization fixed by an antiferromagnetic layer exerting pinning action;
a bias magnetic field-applying layer is formed at each end of said multilayer film in a width direction;
said fixed magnetization layer, said nonmagnetic layer and said free layer extend away from an air bearing surface that is a plane in opposition to a medium, and the length of said fixed magnetization layer in a depth direction normal to said air bearing surface is greater than the length of said free layer in said depth direction; and
a shunt layer for shunting the sense current is located at a farther distance in said depth direction than the free layer, and said shunt layer is separated from said free layer by a constant gap in the depth direction.

2. The thin-film magnetic head according to claim 1, wherein said shunt layer is formed of a same material of which the free layer is formed.

3. The thin-film magnetic head according to claim 2, wherein said shunt layer is formed on said nonmagnetic layer.

4. The thin-film magnetic head according to claim 2, wherein said free layer and said shunt layer are formed as part of a one-piece film.

5. The thin-film magnetic head according to claim 1, wherein the size of the constant gap formed between said free layer and said shunt layer is 10 nm to 100 μm, wherein said constant gap is filled up with a nonmagnetic material.

6. The thin-film magnetic head according to claim 5, wherein said nonmagnetic film is $Al_2O_3$, $SiO_2$, MgO, $TiO_2$, or HfO.

7. The thin-film magnetic head according to claim 1, wherein said magneto-resistive effect device of the CPP structure is a TMR device.

8. The thin-film magnetic head according to claim 1, wherein said magneto-resistive effect device of the CPP structure is a CPP-MR device.

9. The thin-film magnetic head according to claim 1, which further comprises a pair of electrodes for passing a current in a stacking direction of the magneto-resistive effect device of the CPP structure.

10. A head gimbal assembly, comprising:
    a slider including a thin-film magnetic head as recited in claim 1 and located in opposition to a recording medium; and
    a suspension adapted to resiliently support said slider.

11. A magnetic disk system, comprising:
    a slider including a thin-film magnetic head as recited in claim 1 and located in opposition to a recording medium; and
    a positioning means adapted to support and position said slider with respect to said recording medium.

* * * * *